United States Patent
Taghizadeh-Kaschani

(10) Patent No.: US 7,417,301 B2
(45) Date of Patent: Aug. 26, 2008

(54) SEMICONDUCTOR COMPONENT WITH CORELESS TRANSFORMER

(75) Inventor: Karim-Thomas Taghizadeh-Kaschani, Poing (DE)

(73) Assignee: Infineon Technologies AG, Munich (DE)

( * ) Notice: Subject to any disclaimer, the term of this patent is extended or adjusted under 35 U.S.C. 154(b) by 405 days.

(21) Appl. No.: 11/090,955

(22) Filed: Mar. 25, 2005

(65) Prior Publication Data
US 2005/0230837 A1 Oct. 20, 2005

(30) Foreign Application Priority Data
Mar. 25, 2004 (DE) .................. 10 2004 014 752

(51) Int. Cl.
H01L 29/00 (2006.01)
H01L 29/74 (2006.01)
(52) U.S. Cl. ................ 257/531; 257/211; 257/659
(58) Field of Classification Search .......... 257/211, 257/531, 659, E21.022; 336/83, 84 R, 200, 336/232
See application file for complete search history.

(56) References Cited

U.S. PATENT DOCUMENTS

| 5,312,674 | A |  | 5/1994 | Haertling et al. |  |
|---|---|---|---|---|---|
| 5,532,667 | A |  | 7/1996 | Haertling et al. |  |
| 5,936,298 | A | * | 8/1999 | Capocelli et al. | 257/531 |
| 6,225,677 | B1 | * | 5/2001 | Kobayashi | 257/531 |
| 6,639,298 | B2 | * | 10/2003 | Chaudhry et al. | 257/531 |

FOREIGN PATENT DOCUMENTS

| DE | 693 32 599 T2 | 11/2003 |
|---|---|---|
| JP | 07122904 A | 5/1995 |
| WO | WO 92/16043 A1 | 9/1992 |

OTHER PUBLICATIONS

Tang et al., "Coreless Printed Circuit Board (PCB) Transformers with Multiple Secondary Windings for Complementary Gate Drive Circuits", IEEE Transactions on Power Electronics, 1999, vol. 14, No. 3, pp. 431-437, (7 pages).
Kaschani et al., "Coreless Transformer a New Technology for Half Bridge Driver IC's", PCIM 2003, Nuremburg, (4 pages).

* cited by examiner

*Primary Examiner*—Hung Vu
(74) *Attorney, Agent, or Firm*—Maginot, Moore & Beck

(57) ABSTRACT

The invention relates to a semiconductor component having a coreless first transformer (71, 72) which comprises a first (71) and a second (72) planar winding, is arranged on a semiconductor body 9 and is surrounded in the lateral direction by a protective ring (1, 2). The protective ring (1, 2) has metal portions (1a-1d), of which the top metal portion (1a) is further apart of the first planar winding (71) in the lateral direction than the protective ring (1b) which is second from top.

13 Claims, 7 Drawing Sheets

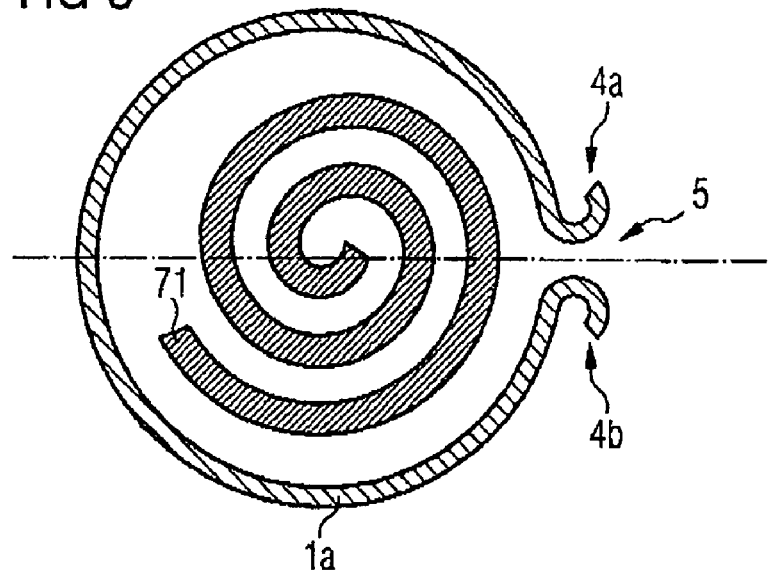
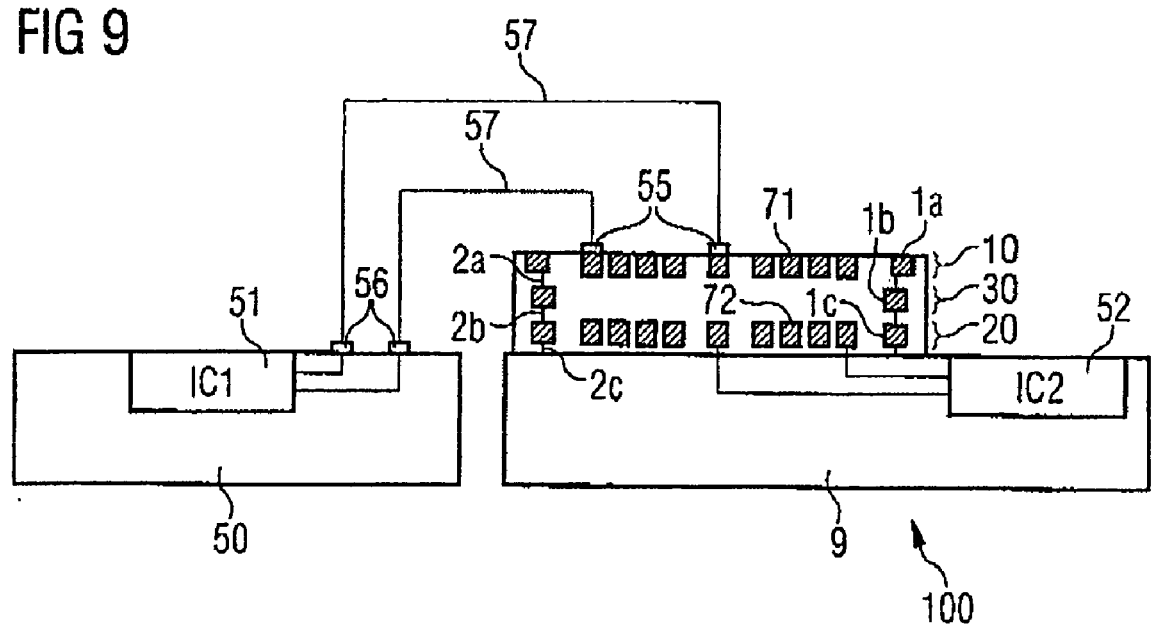

SEMICONDUCTOR COMPONENT WITH CORELESS TRANSFORMER

CROSS-REFERENCE TO RELATED APPLICATIONS

This application claims priority to German Patent Application no. 10 2004 014 752.3-33, filed March 25, 2004.

FIELD OF THE INVENTION

The invention relates to a semiconductor component with a coreless transformer which is surrounded by a protective ring.

BACKGROUND

Such semiconductor components are used in "half-bridges" in drive technology, for example. A half-bridge of this type typically comprises two semiconductor switches with a respective load path and a respective control connection. In this case, the load paths of the two semiconductor switches are connected in series, and applying a control voltage to one of the control connections controls the current flowing via the load path of the associated semiconductor switch. The power switch connected to the lower potential of the supply voltage, preferably to ground, is usually referred to as a low-side switch in this case, and the other is accordingly referred to as a high-side switch.

Normally, the supply voltage which is present across such a half-bridge through the series connection of the load paths is several hundred volts.

The normally high supply voltages mean that the voltages which are required for actuation and which are present across the control connections of the semiconductor switches are also significantly different, typically by several hundred volts.

Usually, the control connections of the two semiconductor switches are actuated by means of actuation electronics which output ground-referenced signals which need to be converted to a high potential in order to actuate the high-side switch.

So that it is not necessary to design such control electronics to be resistant to high voltage, it is expedient to isolate the potentials of the control electronics and of at least one of the control connections.

One option for isolating potentials is indicated in the article by Kaschani, K. T. et al.: "Coreless transformer a new technology for half bridge driver IC's", PCIM 2003, Nuremburg. In this case, the potentials are isolated by means of a transformer which comprises two inductively coupled windings and which is arranged on a semiconductor body.

One option for implementing an arrangement of this type is shown in FIG. 1. In this case, a number of patterned metallization planes 10, 20, 30, 40 are arranged above a semiconductor body 9 and have insulating layers arranged between them.

A first winding 71 and a second winding 72 in a transformer 71, 72 are in the form of planar, spiraled windings 71, 72 and are arranged opposite one another in two different metallization planes 10 and 20. Preferably, both windings have the same center point and also the same external diameter, so as to ensure the best possible magnetic coupling. During operation, a large potential difference can develop between the two windings and can result in very high electrical fields which can adversely affect their environment, particularly surrounding circuit parts.

To avoid these unwanted effects, the transformer has a protective ring 1, 2 arranged around it which is normally electrically conductively connected to the semiconductor body 9.

The protective ring 1, 2 comprises an electrically conductive structure which is formed from metal portions 1a-1d and from vertical connecting elements 2a-2c, such as contact holes. The metal portions 1a-1d are respectively arranged in one of the metallization planes 10, 20, 30, 40 and are at the same lateral spacing from the first planar winding 71. Connecting elements 2a-2c which penetrate the insulating layers connect the metal portions 1a-1d to one another in electrically conductive fashion in the vertical direction of the semiconductor body 9. The protective ring arrangement is connected to the semiconductor body 9 by means of a connection contact 2d.

To protect the exterior of the component from chemical and mechanical influences, the top metallization plane 10 has a passivation layer 6 applied to it which may comprise a layer or a plurality of layer elements. The normally high potential difference between the first planar winding 71 and the protective ring 1, 2 means that the passivation layer 6 may be damaged.

SUMMARY

It is therefore the object of the present invention to present a semiconductor component which has a transformer and a protective ring and which has improved insulation strength over the prior art, and to present a half-bridge which has a semiconductor component of this type.

This object is achieved by a semiconductor component and a half-bridge in accordance with embodiments and developments of the invention.

The inventive semiconductor component has a semiconductor body which bears at least one first and a second patterned metallization plane spaced apart from one another in the vertical direction. The second metallization plane is arranged between the first metallization plane and the semiconductor body.

The semiconductor component also comprises a first and a second planar winding, the first planar winding being formed in the first metallization plane and the second planar winding being formed in the second metallization plane. The first and second planar windings together form a transformer.

This transformer is surrounded in the lateral direction of the semiconductor body by a protective ring which comprises at least one first and a second metal portion, each of the metal portions being arranged in a different metallization plane. In particular, the first metal portion is arranged in the first metallization plane and the second metal portion is arranged in the second patterned metallization plane. All metal portions are parts of a protective ring and are electrically conductively connected to one another.

The first and second planar windings and the metal portions are formed in patterned metallization layers and can be produced using patterning edging methods, for example. Each patterned metallization layer is preferably arranged in one metallization plane.

The metal portion which is furthest apart from the semiconductor body in the vertical direction is subsequently also called the top metal portion.

In addition, a passivation layer is arranged on the top patterned metallization layer, that is to say the patterned metallization layer which is furthest apart from the semiconductor body in the vertical direction.

In line with the invention, provision is made for the lateral spacing between the first planar winding and the top metal portion to be greater than the lateral spacing between the first planar winding and the metal portion which is second from top, that is to say is closest to the top metal portion in the direction of the semiconductor body.

BRIEF DESCRIPTION OF THE DRAWINGS

The invention is explained in more detail below with reference to the appended figures, in which:

FIG. 8 shows a cross-section through an inventive semiconductor component as shown in FIG. 5 in a plane A-A', in which the protective ring is of essentially rotationally symmetrical design but is not closed in the circumferential direction, FIG. 9 shows an exemplary embodiment of the design of an actuation circuit for a half-bridge and, FIG. 10 shows the circuit diagram of a half-bridge which is actuated using the inventive semi-conductor component.

DETAILED DESCRIPTION

In the figures, identical reference symbols denote identical parts with the same meaning, unless stated otherwise.

Figure 1:
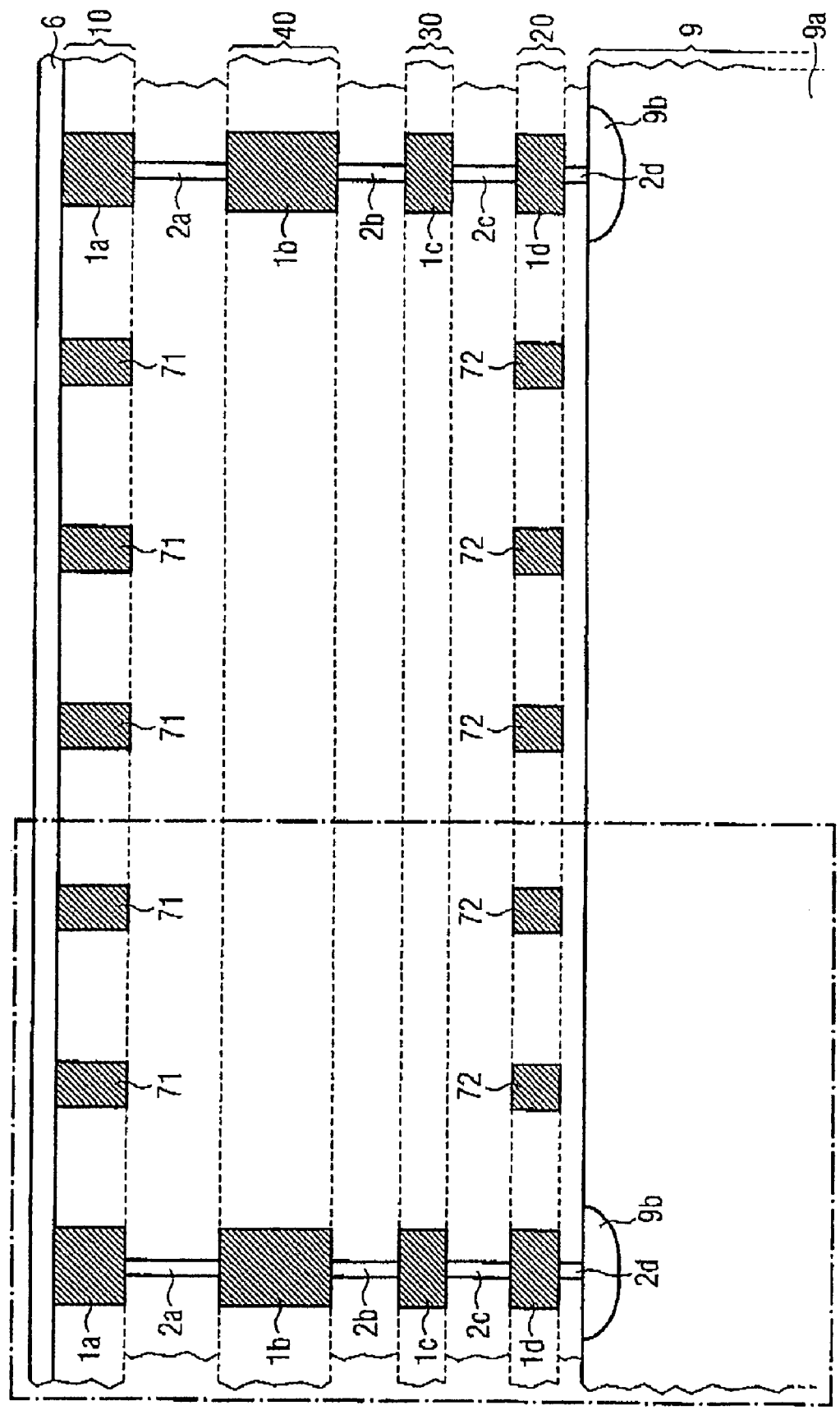
FIG. 1 shows a cross-sectional side view of a portion of a semiconductor component based on the prior art.
Figure 2:
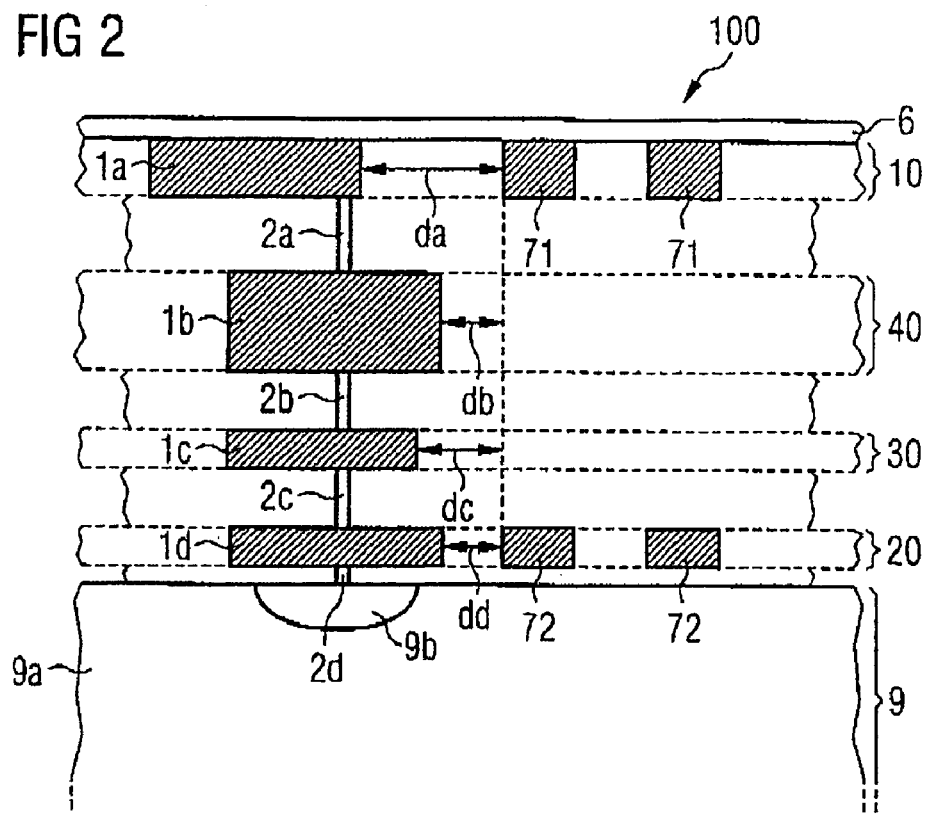
FIG. 2 shows a cross-sectional view of an enlarged portion of an inventive semiconductor component, in which the first planar winding is arranged in the top metallization plane.

FIG. 2 shows a detail from an inventive semiconductor component 100. The position of this detail corresponds to the position of the region which is shown in dashes in FIG. 1. Above a semiconductor body 9 there are a first 10, a second 20 and two further metallization planes 30, 40 spaced apart from one another in the vertical direction of the semiconductor body 9, said metallization planes each containing patterned metallization layers. The second metallization plane 20 is arranged between the first metallization plane 10 and the semiconductor body 9 in this case.

The patterned metallization layer in the first metallization plane 10 forms a first planar winding 71, and the patterned metallization layer in the second metallization plane 20 forms a second planar winding 8. The two windings 71, 72 are arranged so as to be spaced apart from one another. The number of windings in the planar winding 71 may be greater than, less than or, as in FIG. 2, equal to the number of windings in the planar winding 72. The two planar windings 71, 72 together form a first transformer 71, 72.

The first transformer 71, 72 is surrounded in the lateral direction of the semiconductor body 9 by a protective ring 1, 2 which is formed essentially from metal portions 1a-1d, each of which is arranged in a different metallization plane 10, 20, 30, 40.

In particular, a first metal portion 1a is arranged in the first metallization plane 10 and a second metal portion 1d is arranged in the second metallization plane 20. The metal portions 1a-1d are electrically conductively connected to one another by connecting elements 2a-2c which each penetrate the insulating layers arranged between two adjacent metallization layers. The connecting elements 2a-2c are preferably in the form of plated-through holes—"vias"—which electrically conductively connect various metal portions 1a-1d to one another at particular locations in the vertical direction. However, it is likewise possible for the connecting elements 2a-2c to be designed to be closed or at least approximately closed in the circumferential direction of the protective ring 1, 2.

The first planar winding 71 and the second planar winding 72 are insulated from one another by the insulating layers between the individual metallization planes 10, 20, 30, 40 and by insulating material which fills the regions next to the patterned metallization 1b, 1c in the metallization planes 30, 40. In particular, the insulating material is a semiconductor oxide, for example silicon oxide. To obtain as high an insulation strength as possible, the first planar winding 71 and the second planar winding 72 are arranged in the two patterned metallization layers 10 and 20 which are furthest apart from one another. The first planar winding 71 is therefore arranged in the top metallization plane 10, which is furthest apart from the semiconductor body 9 in the vertical direction.

In the present exemplary embodiment, the first metal portion 1a is arranged in the top metallization plane 10 and thus forms the top metal portion of the protective ring 1, 2.

The surface of the semiconductor component 100, which surface is identical to the surface of the top metallization plane 10 in the present exemplary embodiment, has a passivation layer 6 applied to it. The passivation layer 6 protects the exterior of the component from mechanical or chemical influences.

With typical external circuitry connected, the potential difference between the two planar windings 71, 72 is several hundred volts or more. Preferably, the potential difference between the second planar winding and the semiconductor body is comparatively low, which means that the electrical voltage which is present between the protective ring 1, 2 and the first planar winding 71 corresponds in a good approximation to the potential difference between the two planar windings 71, 72 and therefore likewise reaches very high values.

Since this high voltage difference puts a strain on the passivation layer 6, the invention provides for the lateral spacing da between the top metal portion 1a of the protective ring 1, 2 and the first planar winding 71 to be chosen to be greater than the lateral spacing db between the first planar winding 71 and the metal portion 1b which is second from top, i.e. closest to the top portion 1a in the direction of the semiconductor body 9.

It is particularly preferred, as likewise shown in FIG. 2 by way of example, for the lateral spacing between the first planar winding 71 and the top metal portion 1a to be chosen to be greater than the lateral spacing between the first planar winding 71 and each of the other metal portions 1b-1d.

Figure 3:
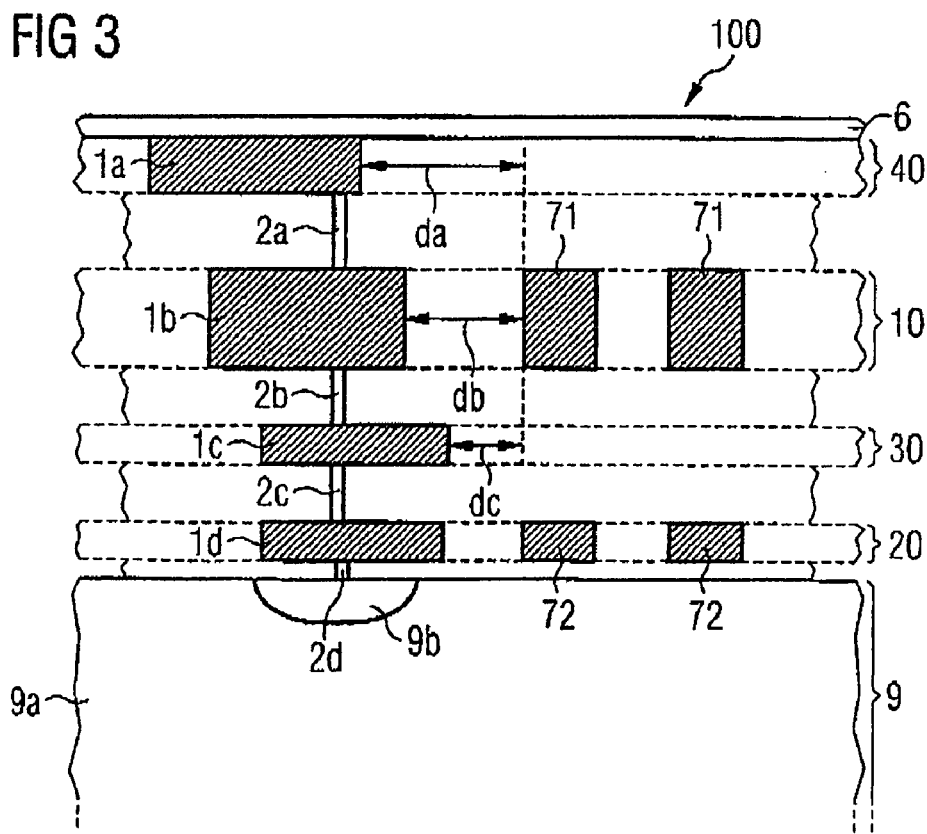
FIG. 3 shows a cross-sectional view of an enlarged portion of an inventive semiconductor component, in which the first planar winding is arranged in a metallization plane below the top metallization plane.

FIG. 3 shows a further exemplary embodiment of a semiconductor component 100 based on the invention. The view corresponds to that in FIG. 2. Unlike in the arrangement shown in FIG. 2, however, the first planar winding 71 is arranged not in the top metallization plane 10 but rather in the metallization plane 40 which is below that.

In the case of such an arrangement, one preferred embodiment of the invention provides for the lateral spacing db between the first planar winding 71 and the first metal portion 1b, which is arranged in the same metallization plane 10 as the first planar winding 71, to be chosen to be greater than the lateral spacing dc between the first planar winding 71 and the metal portion 1c, which is closest to the first metal portion 1b in the direction of the semiconductor body 9.

In line with one particularly preferred embodiment of the invention, all lateral spacings da, db between the first planar winding 71 and a metal portion 1a, 1b, which is arranged in or above the first metallization plane 10, are chosen to be greater than the lateral spacing dc between the first planar winding 71 and the metal portion 1c which is closest to the first metallization plane 10 in the direction of the semiconductor body 9.

The region between the passivation layer 6 and the first planar winding 71 is preferably filled with an insulating material, for example a semiconductor oxide.

Figure 4:
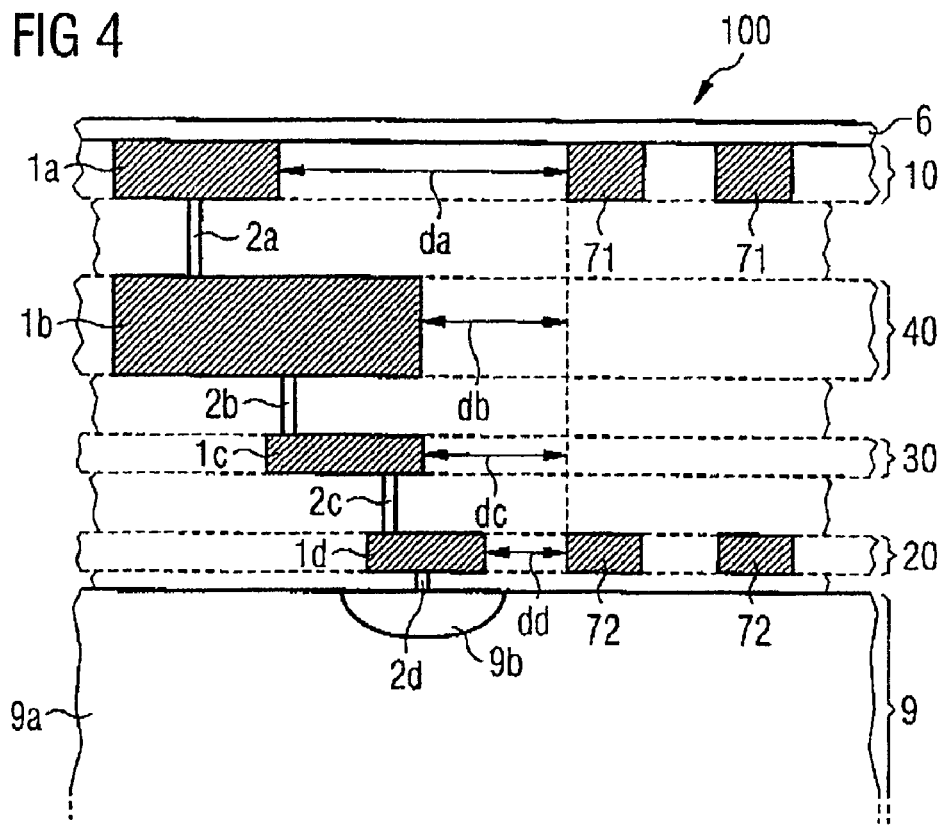
FIG. 4 shows a cross-sectional view of an enlarged detail from an inventive semiconductor component as shown in FIG. 2, in which none of the metal portions is arranged closer to the first planar winding in the lateral direction than all metal portions which are arranged between the respective metal portion and the semiconductor body.

FIG. 4 shows a semiconductor component 100 whose design corresponds to the design which has already been shown in FIG. 2. The difference between the two designs is the arrangement of the metal portions 1a-1d of the protective ring 1, 2 with respect to one another. In this case, the invention provides for each of the portions 1a-1c arranged above the second metallization plane 20 to be at least as far apart from the first planar winding 71 in the lateral direction as the metal portion 1b-1d which is closest, in relation to one of the metal portions 1a-1c which is under consideration, in the direction of the semiconductor body 9.

Figure 5:
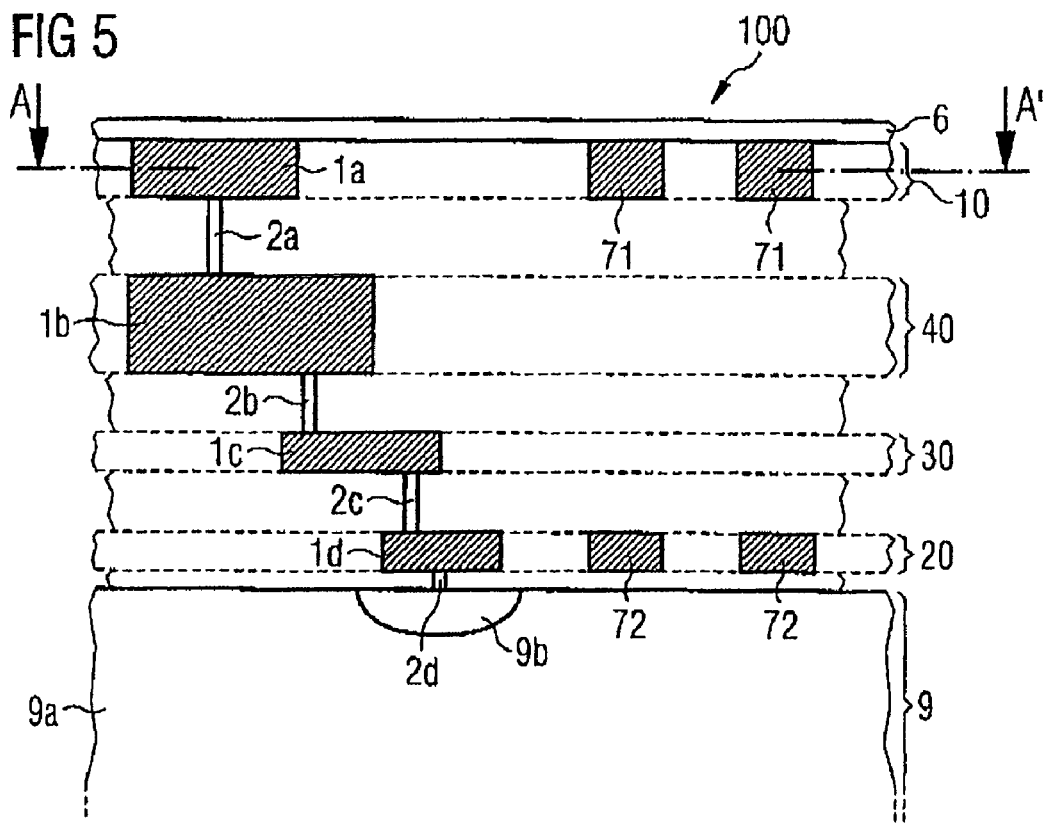
FIG. 5 shows a cross-sectional view of an inventive semiconductor component as shown in FIG. 4, in which the lateral spacing between the first planar winding and a metal portion is greater the further the latter is apart from the semiconductor body in the vertical direction.

One particularly preferred embodiment of an inventive semiconductor component 100, which embodiment corresponds to a special case of the embodiment already shown in FIG. 4, is shown in FIG. 5. In this context, the lateral spacing between the first planar winding 71 and each of the metal portions 1a-1c arranged above the second metallization plane 20 is greater than the lateral spacing between the first planar winding 71 and the metal portion 1b-1d which is closest, in relation to one of the metal portions 1a-1c which is under consideration, in the direction of the semiconductor body 9.

In arrangements in which the first planar winding 71, as shown in FIG. 3, is arranged not in but below the top metallization plane and in which, furthermore, the region above the first planar winding 71 is not filled with an insulator or another solid material up to the top patterned metallization layer, the passivation layer is designed in stages.

In the case of such an arrangement, it is advantageous, in line with a further aspect of the invention, for the lateral spacing db between the first planar winding 71 and the first metal portion 1b to be chosen to be greater than the lateral spacing dc between the first planar winding 71 and the metal portion 1c which is closest to the first metal portion 1b in the direction of the semiconductor body 9.

The protective ring 1, 2 is arranged around the first transformer 71, 72 in the lateral direction. In particular, the individual metal portions 1a-1d are produced essentially as ring sections in the circumferential direction of the protective ring 1, 2, and in line with one preferred embodiment the ring sections are not closed, so that they do not act as a shorting ring for fields which appear in the first transformer 71, 72.

A metal portion 1a-1d which is in the form of an incompletely closed ring section therefore has an opening. An arrangement of this type is shown in FIG. 8. The illustration shows a section through the first metallization plane 10, shown in FIG. 5, in a sectional plane A-A'.

In the lateral direction, the spiraled, first planar winding 71 has a first metal portion 1a arranged around it which is spaced apart from said first planar winding and which is in the form of a ring section of the protective ring 1, 2. The ring section is of essentially annular and rotationally symmetrical design and has an opening 5. In the region of the opening 5, field spikes may arise which the invention avoids by curving the ends 4a, 4b of the ring section which are in the region of the opening 5, the curvature being made toward the external region of the ring section and the direction of curvature being respectively opposite to the direction of curvature of the protective ring.

Like the metal portions 1a-1d, the connecting elements 2a-2d may also be at least of essentially annular design and preferably of essentially rotationally symmetrical design, so that they too represent ring sections of the protective ring 1, 2.

Accordingly, connecting elements 2a-2d in the form of ring sections preferably have openings, in the region of which their respective ends are designed in line with the ends of the ring section which are explained above.

Advantageously, all metal portions 1a-1d and all connecting elements 2a-2d are of essentially annular design and are provided with openings, the openings preferably being arranged above one another in the vertical direction such that the protective ring 1, 2 formed from the metal portions 1a-1d and from the connecting elements 2a-2d has a gap which is continuous in the vertical direction and which is formed from the openings in the ring sections. Preferably, the gap is oriented to a region of the semiconductor component which is as insensitive as possible toward electromagnetic interference.

FIG. 9 shows an actuation circuit for a half-bridge with potential isolation using a semiconductor component 100 based on the invention.

The support 50 has a control circuit 51 arranged on it which actuates a power semiconductor switch (not shown) whose potential differs from that of the control circuit 51 by several hundred volts.

This high potential difference means that actuation is effected using an inventive semiconductor component 100 which allows potential isolation between the control circuit 51 and the power semiconductor switch which is to be actuated.

The inventive semiconductor component 100 has a semiconductor body 9 with a coreless first transformer 71, 72, which comprises a first planar winding 71 and a second planar winding 72 opposite the latter. The first planar winding 71 is arranged in a first metallization plane 10, and the second planar winding 72 is arranged in a second metallization plane 20. The two windings 71, 72 are electrically insulated from one another. A third metallization plane 30 is arranged between the first metallization plane 10 and the second metallization plane 20.

The careless first transformer 71, 72 is surrounded by a protective ring 1, 2 which has metal portions 1a, 1b and 1c formed in the metallization planes 10, 20, 30, which are electrically conductively connected to one another by means of connecting elements 2a, 2b and to the semiconductor body 9 by means of a connecting element 2c. The top metal portion 1a, which is arranged in the same metallization plane 10 as the first planar winding 71, is further apart from the first planar winding 71 in the lateral direction than all other metal portions 1b, 1c.

In addition, besides the careless first transformer 71, 72, a receiver circuit 52 which actuates the power semiconductor switch which is to be actuated is arranged on the semiconductor body 9.

The first planar winding 71 is electrically connected to the control circuit 51 by means of bonding pads 55, 56 and bonding wires 57 formed between the latter, while the second planar winding 72 is connected to the receiver circuit 52. The electrical potentials of the control circuit 51 and of the receiver circuit 52 are isolated by means of the careless first transformer 71, 72.

In this way, the control circuit 51 and the receiver circuit 52 can be operated using separate standard voltages of 3.3 V or 5 V, for example.

Figure 6:
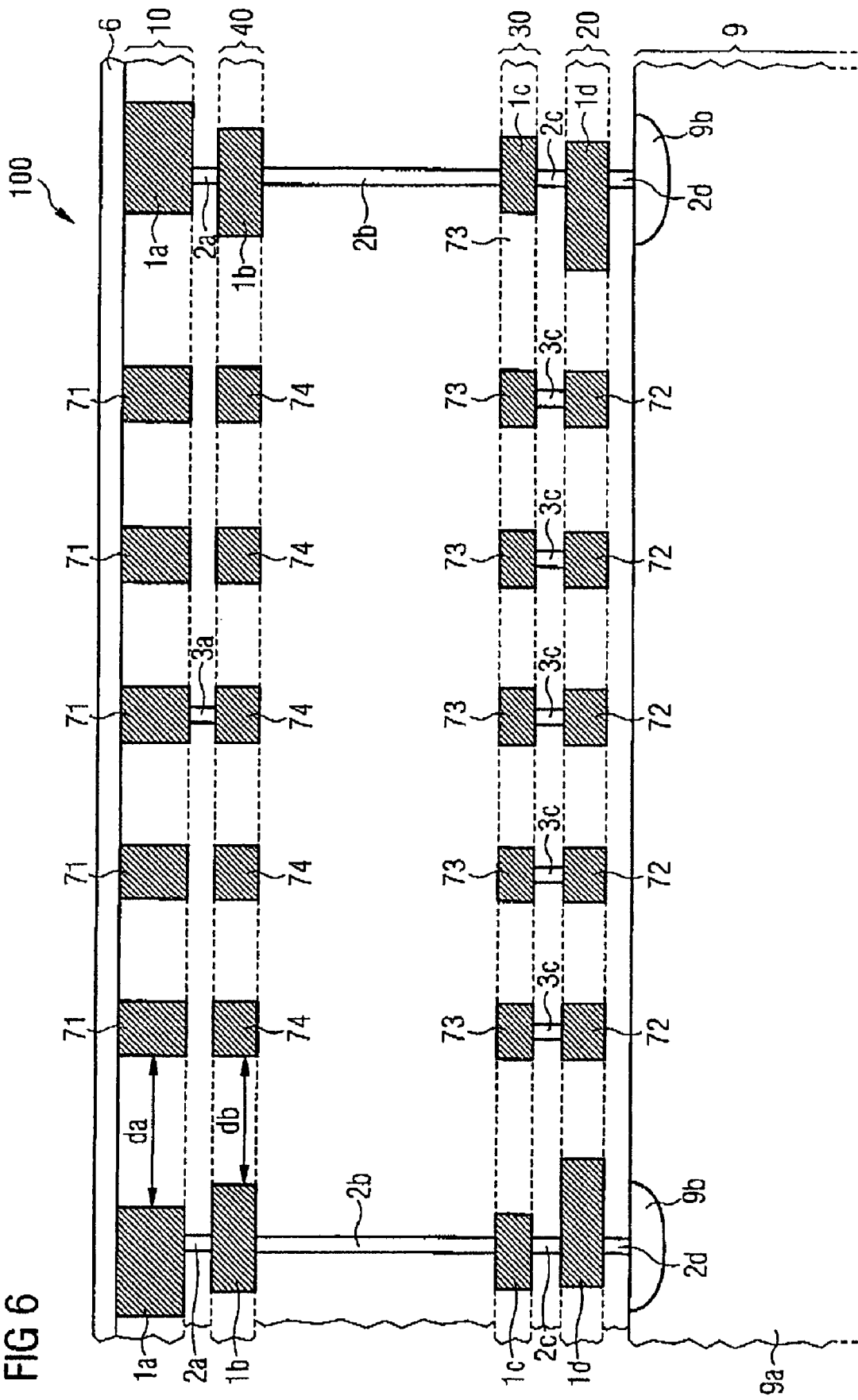
FIG. 6 shows a cross-sectional view of an inventive semiconductor component as shown in FIG. 2, in which the protective ring surrounds not only the first and second planar windings in the lateral direction but also two further planar windings which are connected in series or in parallel with the first or second planar winding.

In particular cases, a higher current-carrying capacity in particular windings or a particular turns ratio in a transformer may be necessary. For this reason, optionally at least one further planar winding is provided which is arranged in a metallization plane other than the first 10 and second 20 metallization planes and which is connected in parallel or in series with the first planar winding 71 or with the second planar winding 72. A preferred exemplary embodiment for this is shown in FIG. 6.

The arrangement shown corresponds to that in FIG. 2, but additionally comprises two further planar windings 73 and 74 which are each arranged in a metallization plane 40 or 30 which is adjacent to the first 10 or second 20 metallization plane and which, like the first 71 and the second 72 planar winding, are surrounded by the protective ring 1, 2 in the lateral direction.

As FIG. 2 shows, the invention provides for the lateral spacing da between the top metal portion 1a of the protective ring 1, 2 and the first planar winding 71 to be chosen to be greater than the lateral spacing db between the first planar winding 71 and the metal portion 1b which is second from top, i.e. closest to the top portion 1a in the direction of the semiconductor body 9.

The further planar winding 74 is electrically connected in series with the first planar winding 71 by means of a conductive connecting element 3a. As shown, the connecting element 3a preferably connects the internal ends of the planar windings 71, 74 connected in series.

The other 73 of the further planar windings 73, 74 is connected in parallel with the second planar winding 72 using connecting elements 3c. Two or more connecting elements 3c may be spaced apart from one another in lateral directions. Preferably, the connecting elements 3c are of integral design and themselves form a planar winding which electrically connects the planar windings 72 and 73.

This exemplary embodiment has been used to show how two planar windings can be connected in parallel or in series with one another. In this case, it does not matter whether the two planar windings are arranged in metallization planes which are adjacent to one another.

Accordingly, it is also possible to connect more than two planar windings to one another, these windings being able to have any combinations of parallel and series circuits between them in pairs.

The connecting elements 3a, 3c may be in the form of plated-through holes, for example, in line with the connecting elements 2a to 2d.

In addition, provision is optionally made for more than one transformer to be used, as required in the case of a normal-mode transmission method, for example. In this case, two or more transformers may be surrounded by a single, common protective ring 1, 2 in the lateral direction in line with their external shape.

Figure 7:
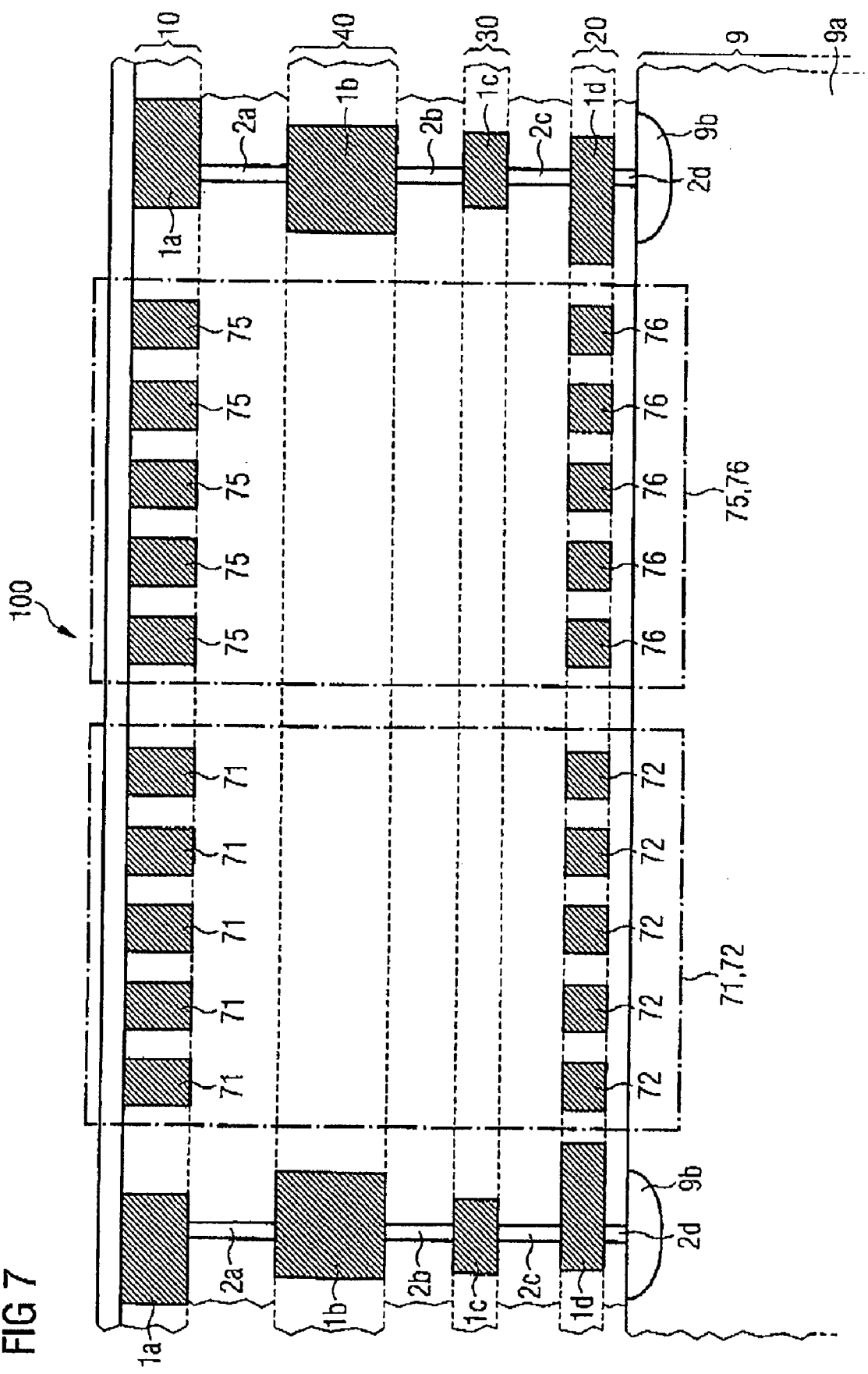
FIG. 7 shows a cross-sectional view of an inventive semiconductor component as shown in FIG. 2, in which the protective ring surrounds not only the first transformer in the lateral direction but also a second transformer which is spaced apart from the first transformer.

A preferred exemplary embodiment for this is shown in FIG. 7. The inventive semiconductor component 100 shown corresponds to the semiconductor component shown in FIG. 2 and also has two further planar windings 75, 76 which are arranged opposite one another in different metallization planes 10, 20 and which form a second transformer 75, 76 which is arranged spaced apart from the first transformer 71, 72 in the lateral direction and which is likewise surrounded by the protective ring 1, 2 in the lateral direction.

Preferably, as shown, a respective one of the further planar windings 75, 76 is arranged in the first 10 or second 20 metallization plane, and hence in the same metallization plane 10 or 20 as the first 71 and the second 72 planar winding. Generally, any different planar windings may also be arranged in different metallization planes, however.

With particular preference, the first transformer 71, 72 and the second transformer 75, 76 are of the same design as one another and have the same winding direction. This allows differential evaluation of the signals processed in the individual transformers, which means that it is possible, by way of example, to distinguish between an interference signal and a useful signal.

In particular, it is advantageous if the protective ring 1, 2 is arranged symmetrically with respect to the total arrangement comprising the first 71, 72 and the second 75, 76 transformer.

Figure 10:
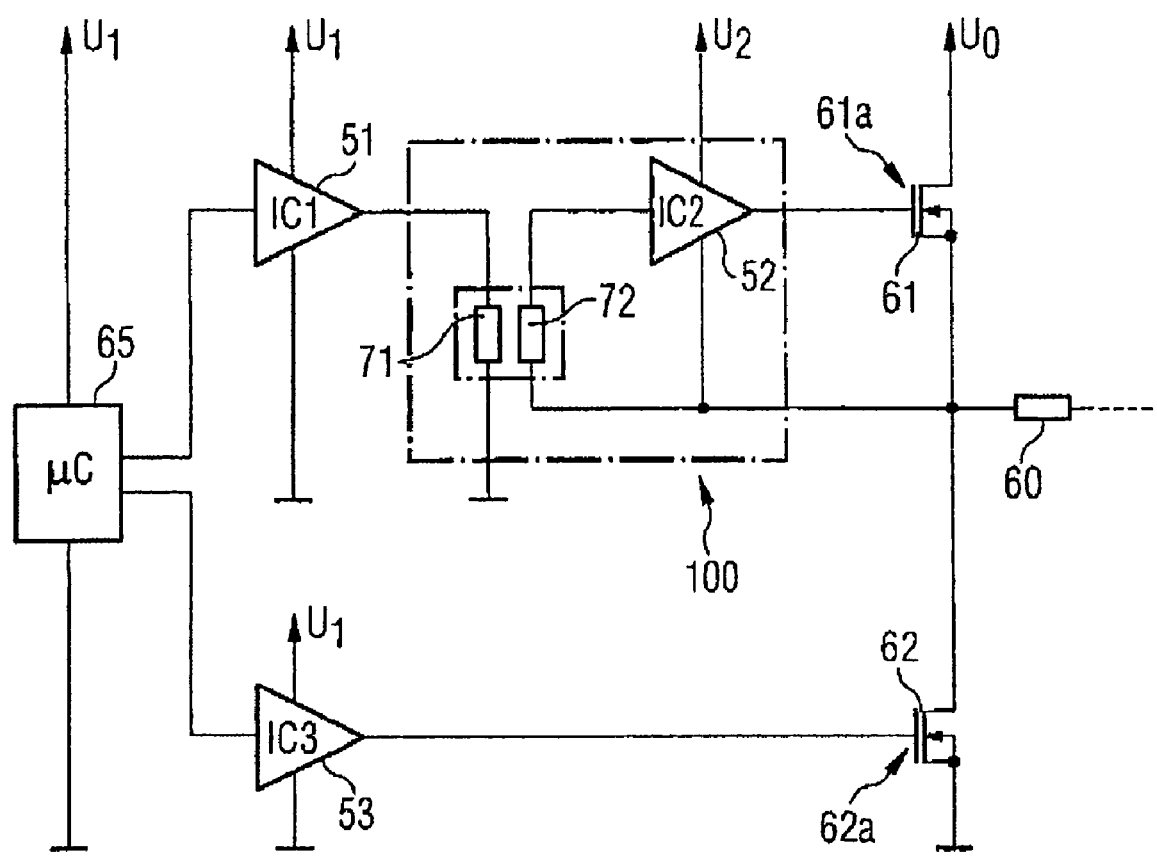

The circuit diagram for a half-bridge actuated using an inventive semiconductor component 100 is shown in FIG. 10. The half-bridge comprises a low-side switch 62 and a high-side switch 61 which are connected in series and which have a common connection to which a load 60 is connected.

In the present exemplary embodiment, the low-side switch 62 and the high-side switch 61 are in the form of MOSFETs 61 and 62, it being possible to use, in principle, any other power semiconductor switches which have a control connection, such as IGBTs.

The power semiconductor switches 61, 62 are actuated via the control circuits 51 and 53 by a common control unit 65, which may comprise a microcontroller or a microprocessor, for example.

The high-side switch 61 has a comparatively high supply voltage U0 of several hundred volts applied to it. The control unit 65 and the two control circuits 51, 53 have a supply voltage U1 applied to them, which may be 3.3 V or 5 V, for example. The receiver circuit 52 likewise has a supply voltage U2 applied to it which may be 3.3 V or 5 V, for example. Since the reference-ground potential for the receiver circuit 52 is formed by the common connection of the low-side switch 62 and of the high-side switch 61, however, the voltages in the receiver circuit 52 may be several hundred volts different than those in the control unit 65 or in the control circuits 51, 53, depending on the state of the low-side switch 62 or of the high-side switch 61.

The control unit 65 actuates both the high-side switch 61 and the low-side switch 62 of the half-bridge. To isolate the potential in the control circuit 51 from the high potential applied to the high-side switch 61, in particular, a semiconductor component 100 based on the invention is provided.

The semiconductor component 100 has a coreless first transformer 71, 72 and a receiver circuit 52, which receives a control signal transmitted from the control circuit 51 by means of the first coreless transformer 71, 72 and, for its part, actuates the high-side switch 61 of the half-bridge.

| List of reference symbols | |
|---|---|
| 1a | First metal portion |
| 1d | Second metal portion |
| 1b, 1c | Further metal portion |
| 2a-2d | Connecting element |
| 4a, 4b | Ends of the ring section 1a |
| 5 | Opening in the ring section 1a |
| 6 | Passivation layer |
| 9 | Semiconductor body |
| 9a | Region of the semiconductor body which adjoins the zone of contact |
| 9b | Zone of contact in the semiconductor body |
| 10 | First metallization plane |
| 20 | Second metallization plane |
| 30, 40 | Further metallization plane |
| 50 | Support |
| 51, 53 | Control circuit |
| 52 | Receiver circuit |
| 55, 56 | Bonding pad |
| 57 | Bonding wire |
| 60 | Load |
| 61 | High-side switch |
| 62 | Low-side switch |
| 61a | Control connection for the high-side switch |
| 62a | Control connection for the low-side switch |
| 65 | Control unit |
| 71 | First planar winding |
| 72 | Second planar winding |
| 73, 74, 75, 76 | Further planar winding |
| 100 | Semiconductor component |

The invention claimed is:

1. A semiconductor component comprising:
a semiconductor body;
plural vertically displaced metallization planes supported on the semiconductor body including at least a first metallization plane and a second metallization plane, the first metallization plane including a first planar winding of a first transformer, the second metallization plane including a second planar winding of the first transformer, the second metallization plane arranged between the semiconductor body and the first metallization plane;
a protective ring surrounding the first transformer in the lateral direction of the semiconductor body, the protective ring having at least one first metal portion and at least one further metal portion, the metal portions being electrically conductively connected to one another, the first metal portion arranged in the first metallization plane and at least one further metal portion arranged in at least one further metallization plane; and
a passivation layer arranged on a metallization plane which is furthest apart from the semiconductor body in the vertical direction; wherein a metal portion which is furthest apart from the semiconductor body in the vertical direction is further apart from the first planar winding in a lateral direction component than a metal portion which is closest, in the vertical direction of the semiconductor body, to the metal portion which is further apart in the lateral direction component from the first planar winding.

2. The semiconductor component as claimed in claim 1, wherein the metal portion which is further apart in the lateral direction component from the first planar winding is the first metal portion.

3. The semiconductor component as claimed in claim 1, wherein the lateral direction component of the spacing between the first planar winding and a topmost of the metal portions is greater than the lateral direction component of the spacing between the first planar winding and each of the other metal portions.

4. The semiconductor component as claimed in claim 3, wherein the first metal portion is the topmost metal portion.

5. The semiconductor component as claimed in claim 1, wherein the lateral direction component of the spacing between the first planar winding and a selected metal portion is greater than or equal to the lateral direction component of the spacing between the first planar winding and any other metal portion which is disposed closer to the semiconductor body than the selected metal portion.

6. The semiconductor component as claimed in claim 5, wherein the lateral direction component of the spacing between the first planar winding and the selected metal portion is greater than the lateral direction component of the spacing between the first planar winding and any other metal portion which is disposed closer to the semiconductor body than the selected metal portion.

7. The semiconductor component as claimed in claim 1, wherein the protective ring is of essentially rotationally symmetrical design.

8. The semiconductor component, as claimed in claim 1, wherein the protective ring defines a gap running in the vertical direction.

9. The semiconductor component as claimed in claim 1, wherein the protective ring is electrically connected to the semiconductor body.

10. A semiconductor component comprising:
a semiconductor body;
plural vertically displaced metallization planes supported on the semiconductor body including at least a first metallization plane and a second metallization plane, the first metallization plane including a first planar winding of a first transformer, the second metallization plane including a second planar winding of the first transformer, the second metallization plane arranged between the semiconductor body and the first metallization plane,
a protective ring surrounding the first transformer surrounded in the lateral direction of the semiconductor body, the protective ring having at least one first metal portion and at least one further metal portion, the metal portions being electrically connected to one another, the first metal portion arranged in the first metallization plane and at least one further metal portion arranged in at least one further metallization plane, and
a passivation layer arranged on a metallization plane which is furthest apart from the semiconductor body in the vertical direction,
wherein a metal portion closest to the passivation layer in the vertical direction is further apart from the first planar winding in a lateral direction component than at least one other metal portion.

11. The semiconductor component as claimed in claim 10, wherein the metal portion closest to the passivation layer is the first metal portion.

12. The semiconductor component, as claimed in claim 10, wherein the protective ring defines a gap running in the vertical direction.

13. The semiconductor component as claimed in claim 12, wherein the protective ring is electrically connected to the semiconductor body.

* * * * *